(12) United States Patent
Khosravirad et al.

(10) Patent No.: US 10,763,998 B2
(45) Date of Patent: Sep. 1, 2020

(54) ENHANCED FEEDBACK SIGNALLING

(71) Applicant: Nokia Technologies Oy, Espoo (FI)

(72) Inventors: Saeed Reza Khosravirad, Wroclaw (PL); Klaus Ingemann Pedersen, Aalborg (DK); Krystian Pawlak, Ostrow Wielkopolski (PL)

(73) Assignee: Nokia Technologies Oy, Espoo (FI)

( * ) Notice: Subject to any disclaimer, the term of this patent is extended or adjusted under 35 U.S.C. 154(b) by 39 days.

(21) Appl. No.: 16/313,517

(22) PCT Filed: Jun. 28, 2016

(86) PCT No.: PCT/FI2016/050470
§ 371 (c)(1),
(2) Date: Dec. 27, 2018

(87) PCT Pub. No.: WO2018/002410
PCT Pub. Date: Jan. 4, 2018

(65) Prior Publication Data
US 2019/0165893 A1    May 30, 2019

(51) Int. Cl.
*H04L 1/16* (2006.01)
*H03M 13/09* (2006.01)
(Continued)

(52) U.S. Cl.
CPC .......... *H04L 1/1621* (2013.01); *H03M 13/09* (2013.01); *H03M 13/6306* (2013.01);
(Continued)

(58) Field of Classification Search
CPC ... H04L 1/1614; H04L 1/0001; H04L 1/1671; H04L 1/1621; H04L 1/1825;
(Continued)

(56) References Cited

U.S. PATENT DOCUMENTS

| 2009/0313516 A1 | 12/2009 | Shin et al. ................. 714/748 |
| 2010/0325507 A1 | 12/2010 | Sung et al. ................. 714/749 |

(Continued)

FOREIGN PATENT DOCUMENTS

| EP | 2 913 951 A1 | 9/2015 |
| WO | WO 2008/115014 A2 | 9/2008 |

(Continued)

OTHER PUBLICATIONS

"On Hybrid ARQ functionality for 5G", Nokia, Alcatel-Lucent Shanghai Bell, 3GPP TSG-RAN WG1 #85, R1-165373, May 23-27, 2016, 3 pgs.

*Primary Examiner* — Guy J Lamarre
(74) *Attorney, Agent, or Firm* — Harrington & Smith

(57) ABSTRACT

A method includes detecting (205), in a first communications apparatus, the number of failed code blocks in a transport block transmitted to the first apparatus from a second apparatus and a corresponding feedback size indicator. The feedback size indicator is received in the first apparatus from the second apparatus e.g. via control channel signalling. Alternatively, the feedback size indicator is received in the transport block. The first apparatus selects the format of a HARQ feedback message to be generated based on the feedback size indicator, and generates the feedback message based on the number of failed code blocks in the transport block. The generated feedback message is of the selected format and indicates the failed code blocks in the transport block. The first apparatus transmits the generated feed back message to the second apparatus.

21 Claims, 9 Drawing Sheets

(51) Int. Cl.
*H03M 13/00* (2006.01)
*H04L 1/18* (2006.01)
*H04L 1/20* (2006.01)

(52) U.S. Cl.
CPC .......... *H04L 1/1825* (2013.01); *H04L 1/1864* (2013.01); *H04L 1/1614* (2013.01); *H04L 1/1671* (2013.01); *H04L 1/203* (2013.01)

(58) Field of Classification Search
CPC ...... H04L 1/1864; H04L 1/203; H03M 13/09; H03M 13/6306
See application file for complete search history.

(56) References Cited

U.S. PATENT DOCUMENTS

| | | | |
|---|---|---|---|
| 2013/0013976 A1 | 1/2013 | Earnshaw et al. ............ | 714/758 |
| 2013/0223485 A1 | 8/2013 | Bai et al. ...................... | 375/219 |
| 2014/0133471 A1* | 5/2014 | Nammi ................ | H04L 1/0025 |
| | | | 370/336 |
| 2015/0215077 A1 | 7/2015 | Ratasuk et al. | |

FOREIGN PATENT DOCUMENTS

| | | |
|---|---|---|
| WO | WO 2010/005712 A1 | 1/2010 |
| WO | WO 2016/060599 A1 | 4/2016 |
| WO | WO-2016/126653 A1 | 8/2016 |

\* cited by examiner

ENHANCED FEEDBACK SIGNALLING

CROSS REFERENCE TO RELATED APPLICATION

This patent application is a U.S. National Stage application of International Patent Application Number PCT/FI2016/050470 filed Jun. 28, 2016, which is hereby incorporated by reference in its entirety.

FIELD

The invention relates to communications.

BACKGROUND

In wireless communications, codeword transmission may be erroneously received, thus triggering retransmission of the codeword. A hybrid automatic repeat request (HARQ) is a mechanism for the retransmission of lost codewords and forward error correction.

BRIEF DESCRIPTION

According to an aspect, there is provided the subject matter of the inde-pendent claims. Embodiments are defined in the dependent claims.

One or more examples of implementations are set forth in more detail in the accompanying drawings and the description below. Other features will be apparent from the description and drawings, and from the claims.

BRIEF DESCRIPTION OF DRAWINGS

In the following the invention will be described in greater detail by means of preferred embodiments with reference to the accompanying drawings, in which.

DETAILED DESCRIPTION OF SOME EMBODIMENTS

Figure 1:
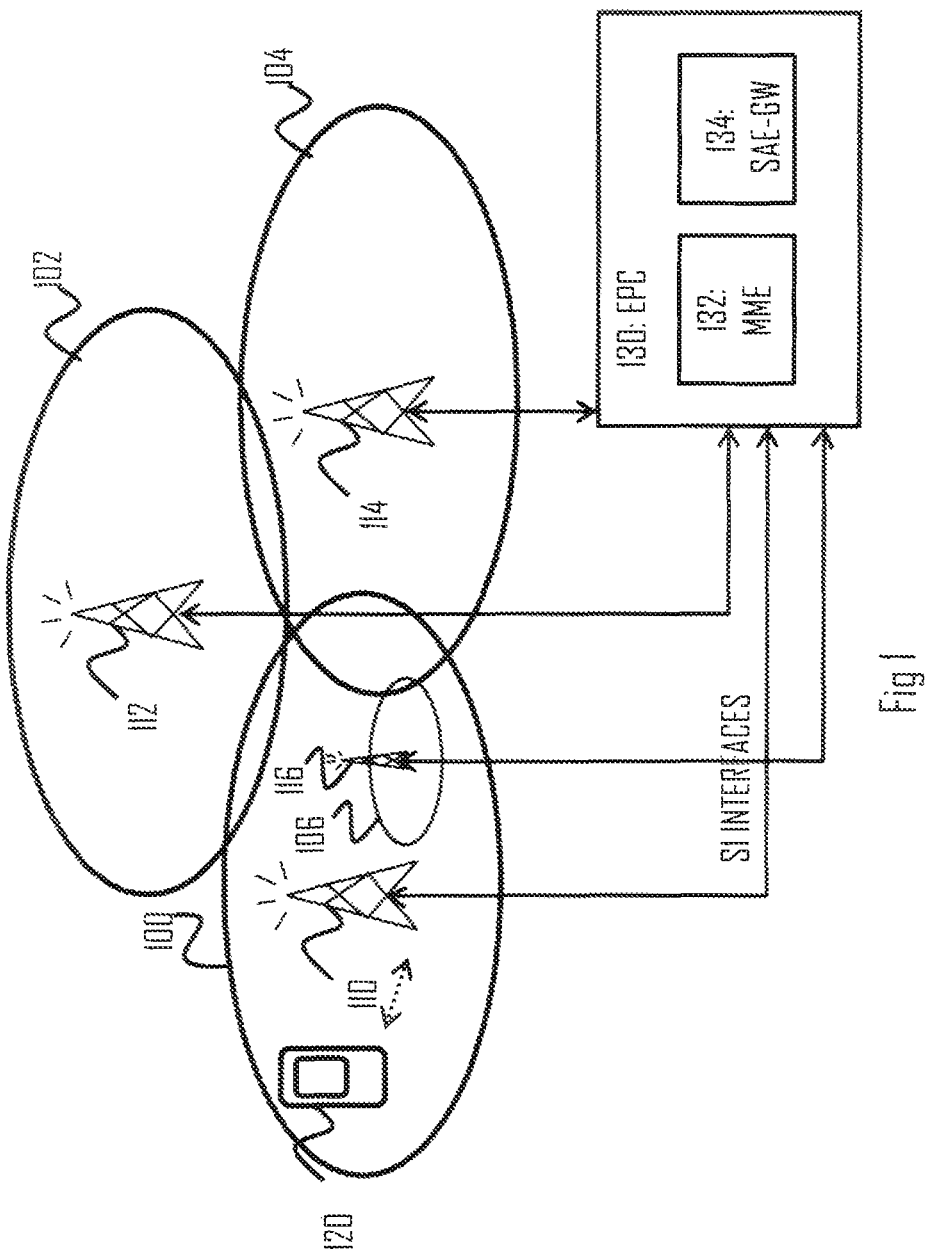
FIG. 1 illustrates a wireless communication system to which embodiments of the invention may be applied.

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Further-more, words "comprising" and "including" should be understood as not limiting the described embodiments to consist of only those features that have been mentioned and such embodiments may contain also features/structures that have not been specifically mentioned.

Embodiments described may be implemented in a radio system, such as in at least one of the following: universal mobile telecommunication system (UMTS, 3G) based on basic wideband-code division multiple access (W-CDMA), high-speed packet access (HSPA), long term evolution (LTE), LTE-advanced, and/or 5G system. The present embodiments are not, however, limited to these systems.

The embodiments are not, however, restricted to the system given as an example but a person skilled in the art may apply the solution to other communication systems provided with necessary properties. One example of a suitable communications system is the 5G system, as listed above. It is assumed that network architecture in 5G will be quite similar to that of the LTE-advanced. 5G is likely to use multiple input-multiple output (MIMO) antennas, many more base stations or nodes than the current network deployments of LTE (a so-called small cell concept), including macro sites operating in co-operation with smaller local area access nodes and perhaps also employing a variety of radio technologies for better coverage and enhanced data rates. 5G will likely be comprised of more than one radio access technology (RAT), each optimized for certain use cases and/or spectrum.

It should be appreciated that future networks will most probably utilize network functions virtualization (NFV) which is a network architecture concept that pro-poses virtualizing network node functions into "building blocks" or entities that may be operationally connected or linked together to provide services. A virtualized network function (VNF) may comprise one or more virtual machines running computer program codes using standard or general type servers instead of customized hardware. Cloud computing or cloud data storage may also be utilized. In radio communications this may mean node operations to be carried out, at least partly, in a server, host or node operationally coupled to a remote radio head. It is also possible that node operations will be distributed among a plurality of servers, nodes or hosts. It should also be understood that the distribution of labour between core network operations and base station operations may differ from that of the LTE or even be non-existent. Some other technology advancements probably to be used are software-defined networking (SDN), big data, and all-IP, which may change the way networks are being constructed and managed.

FIG. 1 illustrates an example of a cellular communication system to which embodiments of the invention may be applied. Cellular radio communication networks, such as the long term evolution (LTE), the LTE-advanced (LTE-A) of the 3rd generation partnership project (3GPP), or the predicted future 5G solutions, are typically composed of at least one network element, such as a network element 110, providing a cell 100. Each cell may be, e.g. a macro cell, a micro cell, femto, or a pico cell, for example. The network element 110 may be an evolved node-B (eNB) as in the LTE and LTE-A, or any other apparatus capable of controlling radio communication and managing radio resources within a cell. For 5G solutions, the implementation may be similar to LTE-A, as described above. The network element 110 may be called a base station or an access node. The cellular communication system may be composed of a radio access network of network elements 110, 112, 114, e.g. eNBs, each controlling a respective cell or cells 100, 102, 104. The network elements 110 to 114 may each control a macro cell 100 to 104 providing wide area coverage for terminal devices 120. The network elements 110 to 114 may also be called access nodes because they provide the terminal devices 120 with wireless access to other networks such as the internet. Additionally, one or more local area access nodes 116 may be arranged within a control area of a network element 110, 112, 114 controlling a macro cell, 100 to 104. The local area access node 116 may provide wireless access within a sub-cell 106 that may be comprised within a macro cell 100. Examples of the sub-cell may include a micro, pico and/or femto cell. Typically, the sub-cell provides a hot spot within a macro cell. The operation of the local area access node 116 may be controlled by a network element 110 under whose control area the sub-cell is provided. The network element 110 and the other network elements 112 to 116 may support dual connectivity (DC) in which the terminal device 120 has established multiple connections with cells associated with a master eNB network element and a secondary eNB network element.

The network element 110 may employ carrier aggregation in which the terminal device 112 is allocated with resources from a plurality of component carriers that may be on contiguous frequency bands or on non-contiguous frequency bands. One network element 110 may provide one component carrier, e.g. a primary component carrier, while another network element 116 may provide another component carrier, e.g. a secondary component carrier. The network element 110 operating the primary component carrier may carry out scheduling of resources on all component carriers, or each network element 110, 116 may control scheduling of the component carrier it operates. Alternatively network element 110 may provide one component carrier, e.g. a primary component carrier, as well as another component carrier, e.g. a secondary component carrier.

In the case of multiple eNBs in the communication network, the eNBs may be connected to each other with an X2 interface as specified in LTE. Other communication methods between the network elements may also be possible. The network elements 110 to 116 may be further connected via an S1 interface to an evolved packet core (EPC) 130, more specifically to a mobility management entity (MME) 132 and to a system architecture evolution gateway (SAE-GW) 134.

The radio system of FIG. 1 may support machine type communication (MTC). MTC may enable providing service for a large amount of MTC capable devices, such as the at least one terminal device 120. The at least one terminal device 120 may comprise mobile phones, smart phones, tablet computers, laptops and other devices used for user communication with the radio communication network, such as a MTC network. These devices may provide further functionality compared to the MTC scheme, such as communication link for voice, video and/or data transfer. However, in MTC perspective the at least one terminal device 120 may be understood as a MTC device. The at least one terminal device 120 may also comprise another MTC capable device, such as a sensor device providing position, acceleration and/or temperature information to name a few examples.

To improve the performance of HARQ transmission, an enriched multi-bit feedback mechanism is being considered for 5G communications systems. The multi-bit feedback mechanism involves informing the transmitter on the state of the decoder (by transmitting accumulated mutual information or a combined effective SINR), so that the transmitter is able to estimate how close the decoder is to achieving successful decoding of a transport block. Uplink resources for the multi-bit feedback need to be allocated for UE to report the decoder state with a reasonable precision.

For throughput sensitive wideband high load data transmission, the transport block size (TBS) is expected to increase to large numbers, because for processing delay reasons, code block (CB) segmentation of the transport block (TB) is considered necessary. For large TBSs, the multi-bit feedback enables a considerably smaller retransmission channel usage, compared to the first transmission channel usage.

If the transport block size of a transport block (TB) exceeds a certain threshold value (e.g. 6144 bits in LTE), the transport block is segmented into several code blocks (CB), so that the code block size (CBS) of each code block is smaller or equal to said threshold value. This is due to the complexity of the encoder and the decoder. The receiver decodes each CB separately, wherein the conventional single-bit HARQ feedback is a positive acknowledgement (ACK) only if each CB in the transport block is correctly decoded. Otherwise the conventional single-bit HARQ feedback is a negative acknowledged (NACK). This means that a single failed CB results in failing the whole TB.

The multi-bit feedback based on the segmentation of the transport block, enables addressing the erroneous CB or multiple erroneous CBs in the transmission of the transport block. The multi-bit feedback enables saving encoder resources by triggering the retransmission of the erroneous (i.e. failed) CBs only, and not the whole TB.

According to LTE 3GPP Release 12, the transport block size (TBS) may be as big as 97 896 bits which after segmentation results in 16 CBs. These figures are expected to be even larger in the 5G system (e.g. high carrier bandwidths of 100 MHz with high order modulations of 64 or 256QAM, along with TTIs that may span from portions of a millisecond to several milliseconds imply TB sizes much bigger than expected for LTE), which increases the significance of providing a CB-based HARQ feedback when TBS is large.

TB BLER (block error rate) ($BLER_{TB}$) as a function of CB BLER ($BLER_{CBi}$) may be roughly expressed as follows (equation (1)):

$$BLER_{TB} = 1 - \Pi_i(1 - BLER_{CBi}) \quad (1)$$

CB BLER is not necessarily equal for different CBs, due to the fact that the segmentation of TB to several CBs occurs through a limited set of interleaved sizes, and as a result each of the CBs are not of equal size. CB decoding successfulness is inde-pendent on the decoding successfulness of other CBs, since they are transmitted via different channel resources.

The probability of having a single CB (or a few CBs in case of a large TBS) failure may then be checked and compared to that of the decoding failure of the whole TB. For simplicity reasons, it is assumed that $BLER_{CBi}$ is the same for each CB, such that (equation (2)):

$$BLER_{CB_i} = 1 - (1 - BLER_{TB})^{\frac{1}{N}} \quad (2)$$

where N represents the number of CBs in TB. Assuming a 10% BLER target for initial transmission of TB and having a different number of CBs in TB, the probability of having k CBs out of N being failed, may be calculated as shown in Table 1.

TABLE 1

Probability of having k CB failures out of N

| Probability of having k failed CBs through the TB transmission | Number of CBs in TB | | | |
|---|---|---|---|---|
| | N = 5 | N = 6 | N = 7 | N = 10 |
| k = 1 | 0.104258188 | 0.104440837 | 0.104571562 | 0.104807418 |
| k = 2 | 0.004347908 | 0.004544954 | 0.004686519 | 0.004943068 |
| k = 3 | 9.0661E−05 | 0.000105484 | 0.000116685 | 0.000138152 |
| k = 4 | 9.45215E−07 | 1.37711E−06 | 1.74313E−06 | 2.53389E−06 |
| k = 5 | 3.94186E−09 | 9.58841E−09 | 1.56242E−08 | 3.18684E−08 |

In Table 1, the probability of having more than one CB failing is reduced with higher k values, and with higher k values it is more likely to have only one or a few of CBs failing. Each of the failed CBs only needs a sub-band of the initial transmission for recovery.

For example, for a carrier bandwidth of 100 MHz, or even larger, as in some 5G design considerations, both FDD and TDD for the high payload TBs may have a high amount of resources in CCH due to larger carrier bandwidths (which gives more room for both DL CCH with the scheduling grant and the UL feedback channel). Thus (enriched) per codeblock HARQ feedback may be used, and CCH may be used to decrease the HARQ retransmission size to a smaller set of resources. An efficient CCH usage in the large carrier bandwidths may directly affect the efficiency of the SCH resources.

If a HARQ retransmission size is set lower than usual, the left-over resources are filled with new data/CCH to be transmitted either to the same or a different UE. The feedback generation needs to be changed from the one-dimensional "success-or-failure" feedback regarding the transmission as a whole, to the two-dimensional "success or failure per segment & performance of the transmission" (hard vs. soft feedback).

For uplink coverage, it is desirable for coverage-limited UEs to have an op-tion to use the single-bit HARQ feedback, since devices experiencing more favourable link budgets may benefit from the use of the multi-bit HARQ feedback.

If the initial transmission of TB fails, one or a few of the CBs may fail in the decoding. The transmitter may benefit from knowing the index of the few failed CBs. If each (or a majority) of the CBs are failed in the decoding process over TB, the information to be transmitted to the transmitter may comprise the performance metric of the decoder status. The transmitter is able to select the retransmission attributes based on the fed back performance metric. The performance metric in this case refers to the state of the decoder (e.g. accumulated mutual information or a combined effective SINR). Thus, if majority of CBs have failed then instead of the indexes of the erroneous CBs, it is better to feed back the performance metric for TB. This also refers to the two dimensional feedback concept where feedback content may vary from per CB ACK/NACK to per TB performance metric.

When a few CBs have failed, the feedback message conveys the indexes of the errored CBs. The retransmission on average uses less resources than the initial transmission, and the freed-up resources may be used for other data. For example, the freed-up radio resources that are not used for the retransmission may be used to schedule data transmissions to the same or other terminal devices.

If only one (or two) of the CBs has failed in the decoding, the fed back information may include the index of the failed CBs, plus some fuzzy information on the decoder performance regarding the failed CBs. The term performance metric may be used in this case to refer to the information on the decoder performance regarding the failed CBs, i.e. decoder state information (such as ACMI, effective SINR, etc.). Thus, when only one or two CBs have failed, the indexes of the failed CBs plus some performance metric information is sent in the feedback message. The index information does not fill up each feedback-message-allocated bit, and thus the remaining bits may be used to report the performance metric of the decoder corresponding to the failed CBs.

In case of a few CB failures, the feedback message may convey the indexes of the failed CBs. Channel/decoder performance metrics such as received SINR and/or decoder performance metrics such as the accumulated mutual information (MI), bit-wise mutual information (BMI) and/or normalized accumulated mutual information (NACMI) in the decoder, may be reported as the decoder status. The term performance metric may be used in this case to refer to the decoder status, i.e. decoder state information.

The feedback channel in UL uses quite a lot of resources in order to keep the feedback message secure from outage. One feedback message (single bit) in LTE may use 12 resource elements with BPSK modulation. However, in good channel conditions (or equivalently when the modulation order, and resultantly TBS, is more likely to be higher), smaller repetition order for the feedback message is still able to guarantee a high level of reliability. Rough calculations based on a given average SINR and error probability of BPSK modulation, are shown in Table 2 illustrating the probability of having an ACK<->NACK error (or 6 or more errors in the feedback channel).

TABLE 2

The probability of feedback alteration with 12 BPSK symbols over an AWGN channel carrying the feedback

| Average SINR dB | ACK<->NACK error with 12 BPSK symbols over AWGN |
|---|---|
| −5 | 0.0263 |
| 0 | 0.000144 |
| 5 | 3.99E−11 |
| 10 | 3.11E−30 |
| 15 | 5.33E−88 |
| 20 | 1.2E−267 |
| 25 | 0 |
| 30 | 0 |

In Table 2, the low probability of feedback outage for high SINR (i.e. a large TBS) is noticeable. Therefore, the large- TBS-based multi-bit feedback generation may also be considered for LTE enhancement.

In some considerations, the multi-bit HARQ feedback may involve the retransmission of "bad parts" of the encoded message (meaning e.g. low received SINR over some parts), wherein the feedback message includes information on where the bad parts are located in a codeword.

Figure 2:
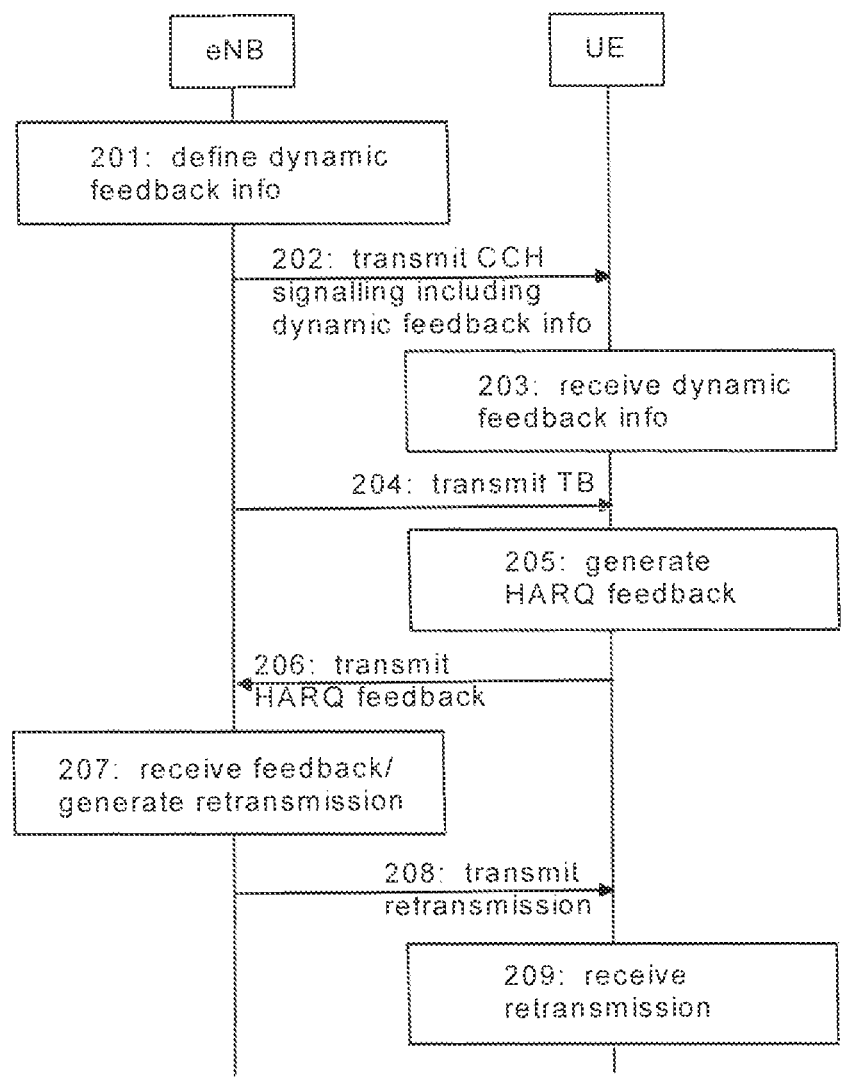
FIGS. 2 and 3 illustrate signalling diagrams of a procedure for an enhanced HARQ procedure according to an embodiment of the invention.

Referring to FIG. 2, the network element, such as network element 110, defines (block 201) a feedback size indicator for a transport block to be transmitted the terminal device (such as terminal device 120). The network element causes (block 202) transmission of the defined feedback size indicator to the terminal device via control channel signalling. The terminal device receives (block 203) the feedback size indicator from the network element via the control channel signalling. The network element causes (block 204) transmission of the transport block to the terminal device. The terminal device detects (block 205) the number of failed code blocks in the transport block transmitted to the terminal device from the network element. The terminal device selects (block 205) the format of a HARQ feedback message to be generated based on the corresponding feedback size indicator received and detected in the terminal device. The terminal device generates (block 205) a HARQ feedback message based on the number of failed code blocks in the transport block, wherein the generated HARQ feedback message is of the selected format and indicates each failed code block in the transport block (if any). The terminal device causes (block 206) transmission of the generated HARQ feedback message to the network element. The network element receives (block 207) the HARQ feedback message from the terminal device. The network element generates (block 207) a retransmission for a transport block such that the retransmission includes each or some of the original code blocks in the transport block, based on the format of the received HARQ feedback message. The retransmission is a transport block containing up to N code blocks, where N is the number of code blocks in the original transmission 204. The network element causes (block 208) transmission of the generated retransmission to the terminal device. The terminal device receives (block 209) the retransmission transmitted by the network element. FIG. 2 illustrates an embodiment where the HARQ feedback message is transmitted on an uplink channel from the terminal device to the network element. However, in another embodiment, HARQ feedback message may also be transmitted on a downlink channel from the network element to the terminal device, i.e. UE transmits 202 the CCH signalling, receives 207 the HARQ feedback, and generates 207 and transmits 208 the retransmission, while eNB receives 203 the CCH signalling, detects the failed code blocks and generates 205 the HARQ feedback, and receives 209 the retransmission.

Figure 3:
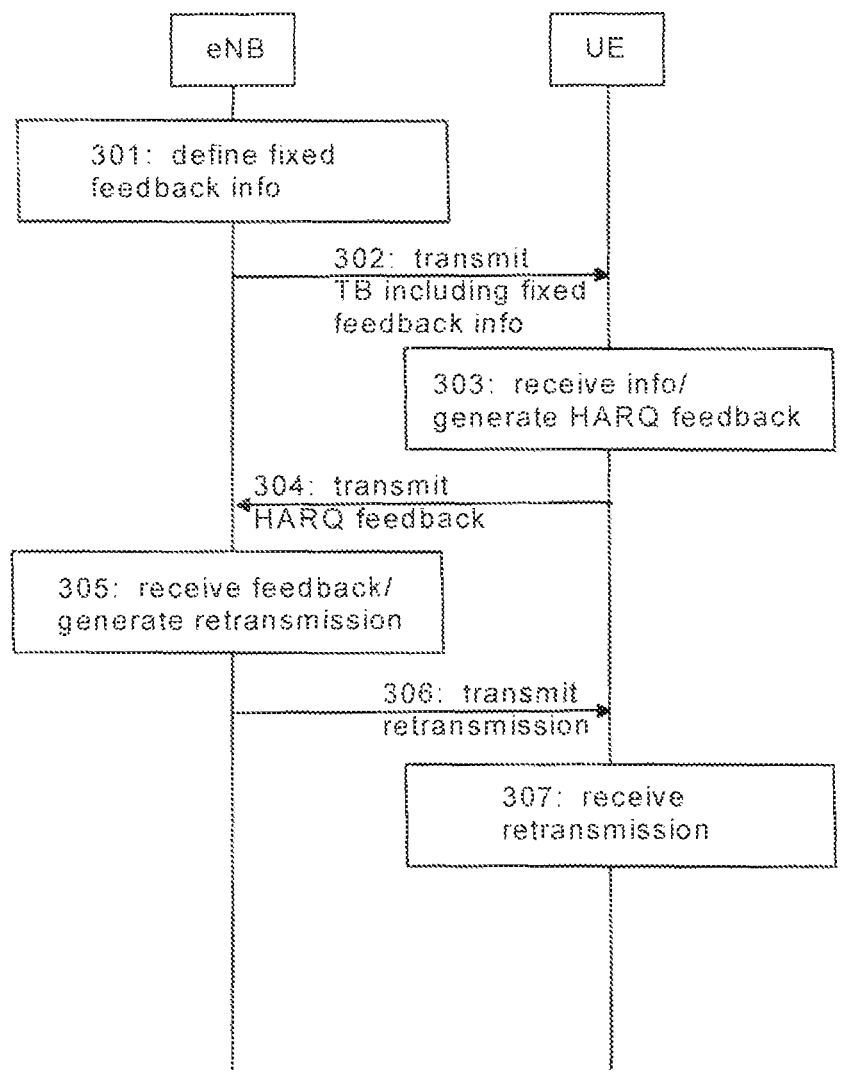

Referring to FIG. 3, the network element, such as network element 110, defines (block 301) a feedback size indicator for a transport block to be transmitted the terminal device (such as terminal device 120). The network element causes (block 302) transmission of the transport block and the defined feedback size indicator to the terminal device, wherein the feedback size indicator is transmitted as the number of code blocks in the transport block, as a transport block size, or as other information indicated in the transmission of the transport block, e.g. control channel information sent together with TB. The terminal device receives (block 303) the feedback size indicator from the network element as the number of code blocks in the transport block or as a transport block size, and detects (block 303) the number of failed code blocks in the transport block transmitted to the terminal device from the network element. The terminal device selects (block 303) the format of a HARQ feedback message to be generated based on the corresponding feedback size indicator received and detected in the terminal device. The terminal device generates (block 303) a HARQ feedback message based on the number of failed code blocks in the transport block, wherein the generated HARQ feedback message is of the selected format and indicates each failed code block in the transport block (if any). The terminal device causes (block 304) transmission of the generated HARQ feedback message to the network element. The network element receives (block 305) the HARQ feedback message from the terminal device. The network element generates (block 305) a retransmission for a transport block such that the retransmission includes each or some of the original code blocks in the transport block, based on the format of the received HARQ feedback message. The retransmission is a transport block containing up to N code blocks, where N is the number of code blocks in the original transmission 302. The network element causes (block 306) transmission of the generated retransmission to the terminal device. The terminal device receives (block 307) the retransmission transmitted by the network element. FIG. 3 illustrates an embodiment where the HARQ feedback message is transmitted on an uplink channel from the terminal device to the network element. However, in another embodiment, HARQ feedback message may also be transmitted on a downlink channel from the network element to the terminal device, i.e. UE transmits 302 the feedback size indicator, receives 305 the HARQ feedback, and generates 305 and transmits 306 the retransmission, while eNB receives 303 the feedback size indicator, detects the failed code blocks and generates 303 the HARQ feedback, and receives 307 the retransmission.

The retransmission may be a retransmission packet generated for the failed code blocks or group of code blocks in the transport block or for the whole transport block, based on the format of the received HARQ feedback message. The retransmission occurs per TB and refers to TB being retransmitted. The retransmission of TB may contain each of N CBs in that TB. However, based on the format of the feedback, the retransmission may exclude retransmission of some CBs, for example, if the feedback message confirms successful delivery of those CBs and a failure of the rest (which are included in the retransmission).

In an embodiment, a feedback message is sent, wherein the feedback type of the message is dependent on the number of incorrectly decoded code blocks, and the indexes of these incorrectly decoded code blocks are also included in the feedback message. The receiver is then able to recognize how many code blocks were incorrectly decoded and thus which ones have to be retransmitted. Thus it is possible to avoid having to retransmit a complete transport block.

An embodiment discloses generating a feedback for a pool of received CBs through different layers/antennas, generating feedback per decoder (i.e. per code block), flexibly adjusting feedback size and/or attributes according to the transmission attributes and codeword sizes, providing a two dimensional soft vs. hard feedback decision for a large TBS, and flexibly changing the feedback mode from hard decision to soft decision (and vice versa) through the HARQ process. A flexible multi-bit feedback with per-decoding (i.e. per CB) analysis for feedback generation is disclosed.

In an embodiment, in order to cover each extreme case, the multi-bit feedback message may be flexible in size. This is achieved by transmitting, to the receiver, downlink CCH signalling on the length of the uplink feedback message that is to be generated by the receiver and sent back to the transmitter. Alternatively, the feedback message may have a standard hard-coded feedback size, e.g. based on the number of CBs in TB (or equivalently TBS). In that case, the downlink CCH signalling needs to be able to switch the receiver feedback generation from single-bit feedback generation to multi-bit feedback generation, and vice versa. Table 3 illustrates exemplary hard-coded feedback sizes.

TABLE 3

Exemplary hard-coded feedback sizes for selecting the number of bits in the feedback in the receiver based on the received TBS

| Number of CBs in TB | Number of bits available for the uplink feedback channel (unless specified as legacy single-bit feedback through the downlink CCH signaling) |
|---|---|
| 4 or less | 4 or 2 or 1 |
| 5-8 | 8 |
| 9-16 | 16 |
| 17-32 | 32 |
| 33 or above | 64 (or may be dynamically specified via downlink CCH, since for this size of TB the CCH overhead ratio is negligible in DL) |

Based on the number of feedback bits, the receiver (i.e. UE in DL HARQ; eNB in UL HARQ) uses a hard-coded algorithm to generate and transmit the feedback message. The transmitter (i.e. eNB in DL HARQ; UE in uplink HARQ) receives the feedback message, and makes an appropriate transmission decision. The feedback format may be indicated in a header attached to the feedback information bits conveyed on the feedback channel. The interpretation of the feedback information bits may depend on the values indicated by the header.

For example, for fast feedback estimation, the performance metric may be based on the received SINR, e.g. collected at a radio head of the C-RAN architecture. For more precise calculation, with enough processing time to go through the decoding it-erations, BMI of the soft decoder outputs may be used as the performance metric. The performance metric is used by the transmitter for setting the retransmission attributes such as the transmission rate.

The soft and hard feedback (performance metric vs. ACK/NACK) is generated per decoding. The pool of code blocks per HARQ process in the receiver comprises each received CB for different layers and multi-connected technologies for said HARQ process. The multi-bit feedback is then generated and reported for said pool of CBs, if resources are available according to the CCH message and/or hard-coded algorithms.

An embodiment is applicable to DL HARQ and/or UL HARQ.

An embodiment enables offering flexibility for different variants of HARQ feedback, depending on TBS and the traffic type. An embodiment enables single-bit ACK/NACK indication, as well as indication of high resolution mutual information per single TB, and indication of errors or MI per individual CB or groups of CBs in the transport block. Depending on the status of the performance metric per CB after checking CRC for each CB, and considering the limitation imposed by the number of bits conveyed on the feedback channel, the receiver may be configured to select the feedback type from a table or list where the status of the CRC check of CBs determines the feedback type according to erroneous CBs (eCBs).

In an example embodiment, for a transport block with 16 CBs and a feedback size of 16 bits (as shown in Table 3), the dynamic size feedback generation shown in Table 4 may be used, allowing the reporting of the ACK/NACK status for significantly more erroneous CBs (eCB).

TABLE 4

Feedback message type for TB with 16 CBs assuming that the feedback message size is 16 bits (e.g. using Table 3 or via CCH signaling)

| Feedback type indicator (FTI) | CRC check status of CBs | Feedback message |
|---|---|---|
| 0 | one eCB | Header + index of eCB + MI (3 + 4 + 9) |
| 1 | two eCBs | Header + indexes of eCBs + individual MIs (3 + 7 + 3 + 3) |
| 2 | three eCBs | Header + indexes of eCBs + overall MI (3 + 10 + 3) |
| 3 | 4 to 6 eCBs | Header + indexes of 6 eCBs (3 + 13) |
| 4 | 7 to 10 eCBs | Header + indexes of 10 eCBs (3 + 13) |
| 5 | 11 to 13 eCBs | Header + indexes of eCBs + overall MI (3 + 10 + 3) |
| 6 | 14 to 16 eCBs | Header + 3 group MIs (3 + 5 + 4 + 4) |
| 7 | no eCBs (ACK) | Header + complementary information (3 + 13) |

In Table 4, the header is equivalent to the feedback type indicator (FTI) and has the number of bits of log 2 (# of FTI). The index of eCB (or eCBs) is given from a table of indexes generated by means of a combination function COMBIN (N, k), with N being the number of CBs in TB, and k being the number of eCBs. The table of indexes may be available as hard-coded, and both eNB and UE are able to refer to the table of indexes in order to interpret the feedback message. The MI performance metric (or any other performance metric representing the decoder state information) may be calculated based on the soft decoder output of the eCBs. The overall MI means that a single performance metric represents each eCB (e.g. by averaging or minimum reporting). The group MI is calculated as overall MI of a subset of eCBs. For example, eCBs may be put in an order (as they are ordered in the transmission) and divided into equal sized subsets of eCBs. The complementary data may include any information useful for the transmitter (e.g. CQI information, decoder performance indicator information, etc.). eNB may be configured to decide what kind of complementary data is transmitted in case of ACK, via CCH signalling, or it may be decided by UE (e.g. UE realizes that the channel quality has changed from the last reporting, wherein UE decides to use the complementary data bits to report the high resolution CQI). In some cases (e.g. FTI=4) the feedback message may be too short to convey each of the indexes of eCBs (for 7, 8 or 9 eCBs, UE needs 14 bits to report the indexes of eCBs). In order the feedback message to also cover short header sizes, the case of 7, 8 and 9 eCBs is grouped with the 10 eCB case (which requires 13 bits to report the indexes). This means that in any of these cases, UE reports 10 eCB indexes, and eNB retransmits the reported eCBs, even though a few of them may have been successfully decoded. This means balancing between limiting the feedback length and the channel utilization efficiency. Grouping may be based on the probabilities of the events of having the different numbers of eCBs, thus enabling more efficient grouping.

In another example embodiment, the dynamic size feedback generation is illustrated in Table 5 showing feedback generation for a case of TBs with 9 CBs and a feedback size of 16 bits (as shown in Table 3). In Table 5, the feedback length is more generous considering the number of CBs, and as a result a larger set of FTIs may be defined.

TABLE 5

Feedback message type for TB with 9 CBs, assuming the feedback message size is 16 bits (e.g. using Table 3 or via CCH signalling)

| Feedback type indicator (FTI) | CRC check status of CBs | Feedback message |
|---|---|---|
| 0 | one eCB | Header + index of eCB + MI (4 + 4 + 8) |
| 1 | two eCBs | Header + indexes of eCBs + individual MIs (4 + 6 + 3 + 3) |
| 2 | two eCBs | Header + indexes of eCBs + overall MI (4 + 6 + 7) |
| 3 | three eCBs | Header + indexes of eCBs + individual MIs (4 + 7 + 2 + 2 + 2) |
| 4 | three eCBs | Header + indexes of eCBs + overall MI (4 + 7 + 6) |
| 5 | four eCBs | Header + indexes of eCBs + 2 group MIs (4 + 7 + 3 + 2) |
| 6 | four eCBs | Header + indexes of eCBs + overall MI (4 + 7 + 5) |
| 7 | five eCBs | Header + indexes of eCBs + 2 group MIs (4 + 7 + 3 + 2) |
| 8 | five eCBs | Header + indexes of eCBs + overall MI (4 + 7 + 5) |
| 9 | six eCBs | Header + indexes of eCBs + 2 group MIs (4 + 7 + 3 + 2) |
| 10 | six eCBs | Header + indexes of eCBs + overall MI (4 + 7 + 5) |
| 11 | seven eCBs | Header + indexes of eCBs + overall MI (4 + 6 + 5) |
| 12 | seven eCBs | Header + indexes of eCBs + 2 group MIs (4 + 6 + 6) |
| 13 | eight eCBs | Header + indexes of eCBs + 2 group MIs (4 + 4 + 8) |
| 14 | nine eCBs | Header + 3 group MIs (4 + 4 + 4 + 4) |
| 15 | no eCBs (ACK) | Header + complementary information (4 + 12) |

The two example embodiments above consider the dynamic size feedback case where a hard-coded table is available for a given number of CBs.

However, the feedback length may be fixed e.g. to 1 bit for less than 16 CBs in TB, and to 16 bits for any number equal to or greater than 16 CBs in TB. For this fixed-size feedback generation, two different approaches are proposed below, which may be used separately or in combination with each other for achieving an efficient feedback message generation.

In an embodiment, the fixed-size feedback generation is based on a given format to report the eCB indexes, wherein h number of bits (e.g. 3) is reserved for the header. The rest of the bits are flexibly deployed based on the number of CBs in TB. Table 6 is based on this approach, however, it may be narrowed down or further extended, if the number of available feedback bits decreases or increases.

TABLE 6

Feedback message format assuming a 16-bits fixed size for 16 or more CBs

| Feedback type indicator (FTI) | CRC check status of CBs | Feedback message |
|---|---|---|
| 0 | one eCB | Header + index of eCB + MI information (3 + n + m) |
| 1 | two eCBs | Header + indexes of eCBs + MI information (3 + n + m) |
| 2 | three eCBs | Header + indexes of eCBs + MI information (3 + n + m) |
| 3 | four eCBs | Header + indexes of eCBs + MI information (3 + n + m) |
| 4 | 13 groups of CBs A/N | Header + ACK/NACK per group of CBs (3 + 13) |
| 5 | 3 groups of CBs MI | Header + MI information per group of CBs (3 + 4 + 3 + 3) |
| 6 | overall MI | Header + overall MI information (3 + 13) |
| 7 | no eCBs (ACK) | Header + complementary information (3 + 13) |

Figure 4:
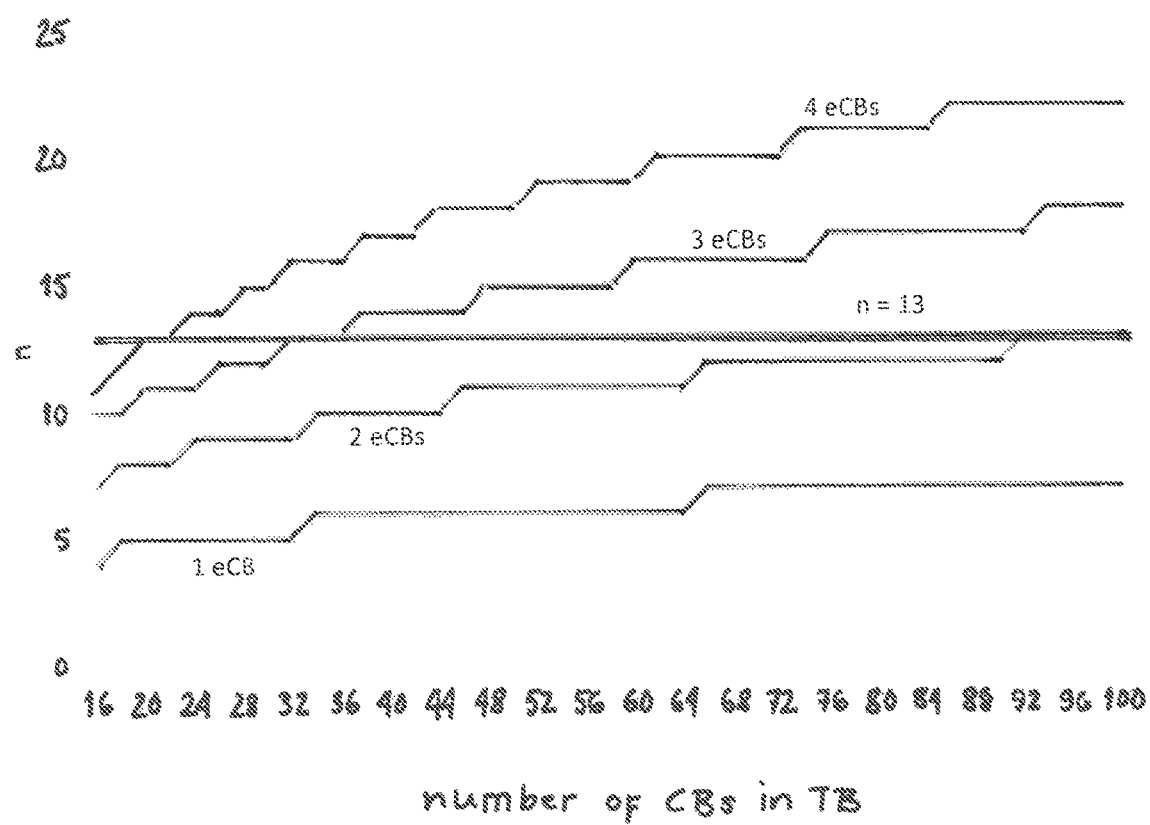
FIG. 4 illustrates the number of bits needed for an eCB index report with respect to the number of CBs in a transport block, for different numbers of eCBs.

In Table 6, the entire size of the feedback message is 16 bits, where first 3 bits (the header) indicate the feedback type, and the rest of the feedback depends on the decoding result. This feedback may be used for any size of TB with 16 or more CBs. It is assumed that the probability of having 1-4 eCBs is high, so one FTI may be assigned to each of these cases. The number of bits to represent the indexes of eCBs (n) in case of FTI of 0-3 depends on the number of CBs in TB. If n≤13, it is possible to use one of these FTIs to generate the feedback. The number n with respect to the number of eCBs and the number of CBs in TB are illustrated in FIG. 4. FTIs of 0 and 1 are applicable to each TB with the maximum of 100 CBs. A TB size of 36 CBs is the maximum TB size where FTI 2 is applicable. For a larger TBS, the number of bits required for n is larger than 13. A TBS of up to 22 CBs with 4 eCBs has an index that fits the feedback format in Table 6. In other words, FTI 3 is only applicable for TBS of lower than 22 CBs. If n<13, the remaining bits (m) are used to report the MI information, otherwise m=0, and no MI information is reported. In case that m is big enough to report more than one MI performance metrics (e.g. in case of FTI 1, 2 and 3 in Table 6 for TBS of 16 CBs), then m is divided to report multiple MIs. This, including the number of MI reports and division of the m bits, may be pre-defined, e.g. hard-coded and/or known by UE and eNB. FTI 4 assumes a grouping into 13 subsets over the CBs in TB (e.g. in case of 19 CBs in TB, the grouping may be as follows: {(0,1) (2,3) (4,5) (6,7) (8,9) (10,11) (12) (13) (14) (15) (16) (17) (18)}, since the grouping may be pre-defined, e.g. hard-coded and/or known by UE and eNB). For each group, an ACK/NACK feedback is generated, wherein the feedback message is ACK only if each CB in the subset is ACKed, and otherwise the feedback message is NACK. This is useful for cases where the number of eCBs is big enough, so that the n bits for the indexes do not fit in the feedback message, but it is less than the majority of CBs. FIG. 4 illustrates the number of bits (n) needed for the eCB index report with respect to the number of CBs in TB, for different numbers of eCBs. FTI 5 assumes grouping CBs into 3 subsets and calculating the overall MI of each group and reporting them separately. This is useful e.g. when the number of eCBs is bigger than in the FTI 4 case, but when the amount of redundancy to be asked for the retransmission is not uniform over the three groups. Therefore, when most eCBs are in the same group(s), MI of the group is reported separately, instead of reporting one TB overall MI. FTI 6 assumes a majority or each of CBs being failed, since a uniform amount of redundancy is needed in the retransmission for each eCB. Therefore, one overall MI is calculated for TB and reported back. The retransmission is in this case generated with the assumption that each CB has failed. In case of no errors, the header indicates ACK, and the remaining bits may be used to send complementary information.

Figure 5:
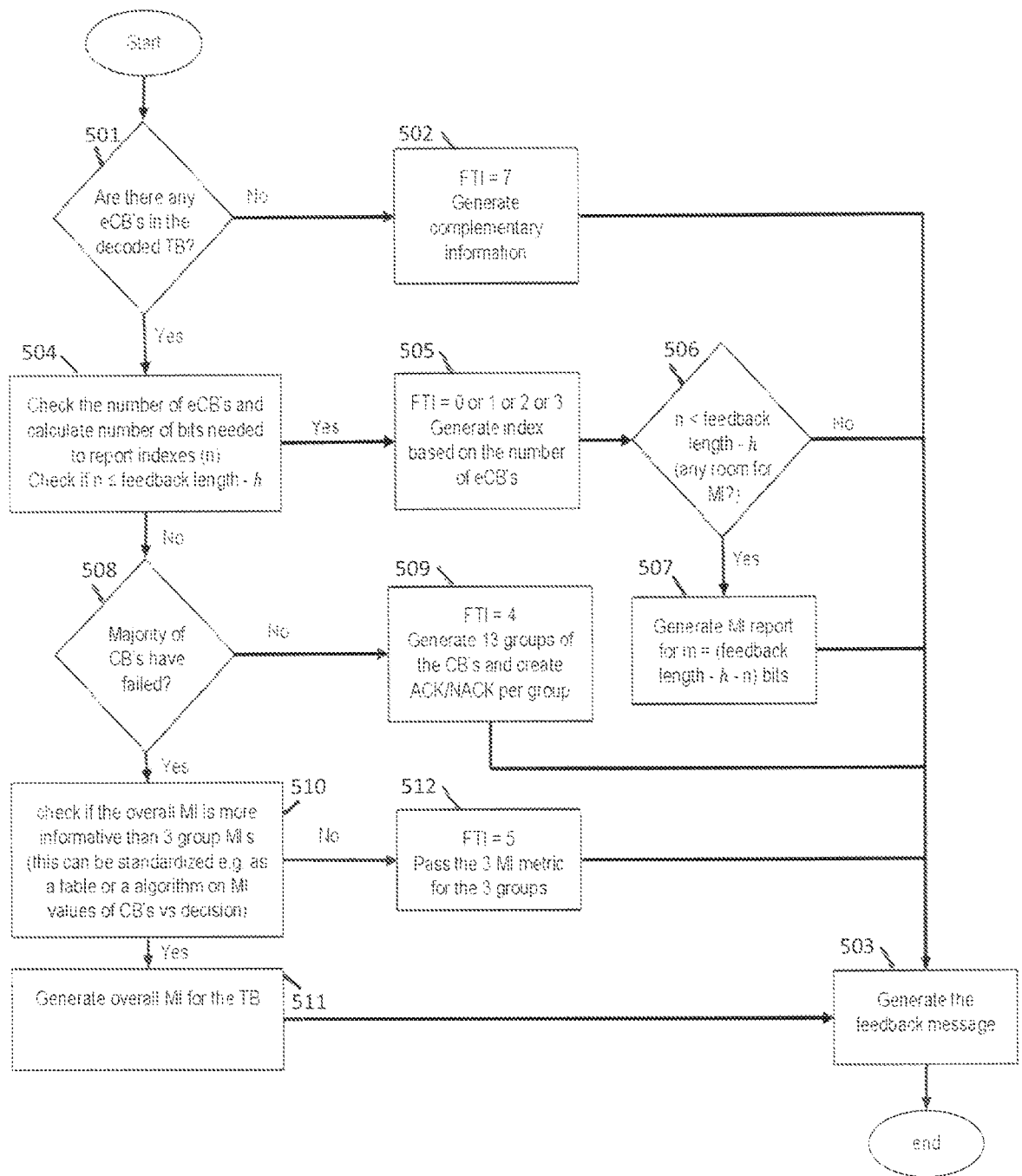
FIG. 5 is a flowchart illustrating fixed-size feedback generation based on a given format.

FIG. 5 is a flowchart illustrating exemplary feedback generation based on a given format to report the eCB indexes. Referring to FIG. 5, an apparatus, such as UE or eNB, may receive a packet and a feedback size indicator, decode TBs, and check (block 501) whether there are any erroneous code blocks in the transport block. If not, the apparatus determines (block 502) based on a predetermined table, e.g. Table 6, that a specific feedback type, e.g. feedback type 7 (the index of Table 6), is to be used, and generates the complementary information. In block 503, the apparatus generates and transmits the feedback message of the selected type 7. If there is at least one erroneous code block in the transport block, the apparatus checks (block 504) the number of eCBs and calculates the number of bits needed to report the index(es) (n) of the failed code block(s). If n≤feedback length (feedback size), then the apparatus determines (block 505) based on Table 6 that feedback type 0 or 1 or 2 or 3 (the index of Table 6) is to be used, and generates the indexes of eCBs based on the number of eCBs. Then the apparatus further checks (block 506) whether n<feedback length−h (where h represents the number of bits in the header). If not, the apparatus generates (block 503) and transmits the feedback message. If n<feedback length−h, the apparatus generates (block 507) an MI report for m bits where m=feedback length−h−n, and generates and transmits (block 503) the corresponding feedback message.

If in block 504 it is determined that n>feedback length (feedback size), then the apparatus checks (block 508) whether a majority of CBs has failed. If not, the apparatus determines (block 509) based on Table 6 that feedback type 4 (the index of Table 6) is to be used, generates groups of CBs, e.g. 13 groups of CBs, and generates (509, 503) and transmits an ACK or NACK feedback message per group. If the majority of CBs has failed, the apparatus checks (block 510) whether the overall MI is more informative than 3 group MIs (e.g. based on a predetermined table or algorithm on CB MIs). If yes, the apparatus generates (block 511) the overall MI for the transport block, and generates and transmits (block 503) the corresponding feedback message. If not, the apparatus determines (block 512) based on Table 6 that feedback type 5 (the index of Table 6) is to be used, uses the group-specific MI metric, e.g. 3 group MIs for the 3 groups, and generates and transmits (block 503) the corresponding feedback message.

In another embodiment, the fixed-size feedback generation is based on grouping of CBs and using a given table, wherein one feedback generation format is used (e.g. Table 4 for TB with 16 CBs). In case of any TBS larger than 16 CBs, grouping of CBs into 16 subsets is applied at first, and then the feedback format to be used for 16 groups of CBs, is similar to the feedback format used for a transport block of 16 CBs.

Figure 6:
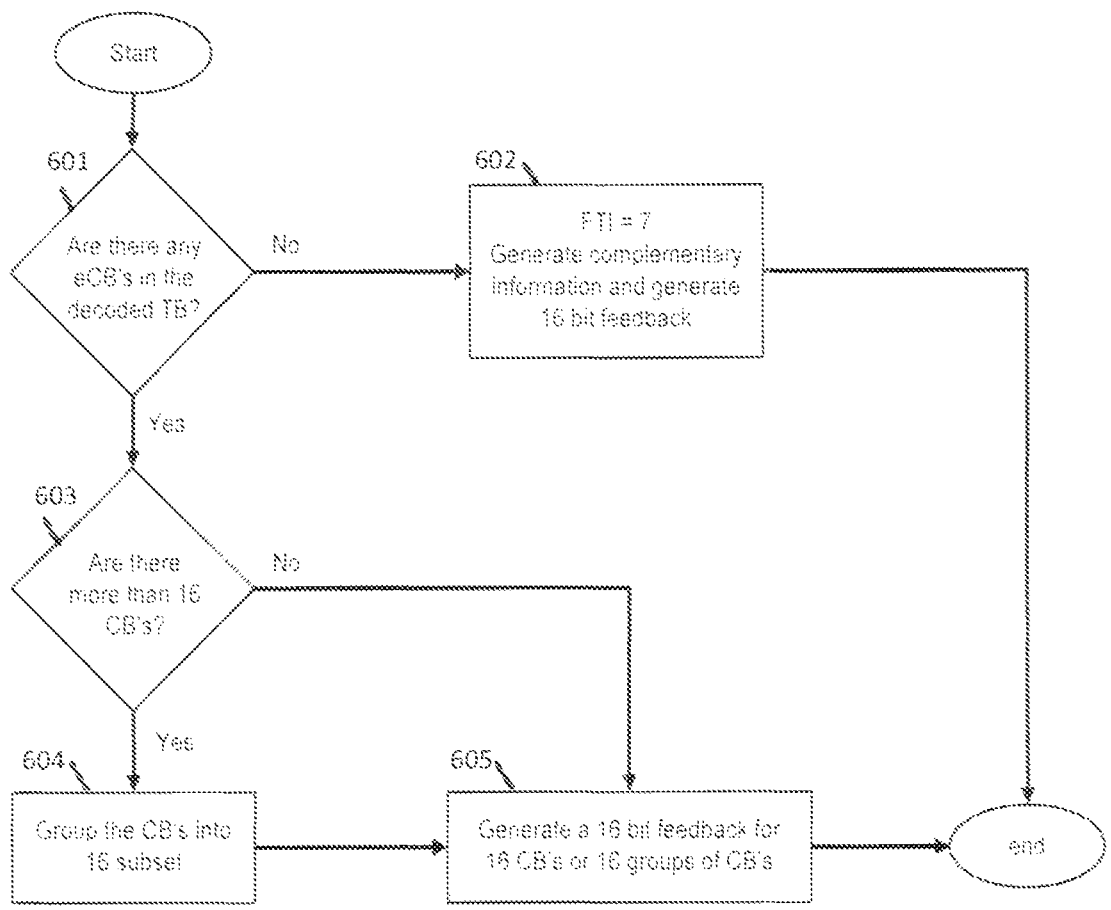
FIG. 6 is a flowchart illustrating fixed-size feedback generation based on grouping of CBs.

FIG. 6 is a flowchart illustrating the fixed-size feedback generation based on the grouping of CBs and using the given table. In FIG. 6, in block 605, a given table may be applied in an apparatus for generating a feedback message with the length of 16 (or any other given number of) bits for 16 CBs. For example, Table 6 may be stored or retrieved in the apparatus, wherein the feedback message is generated based on the selected table for 16 CBs or 16 groups of CBs in case of a larger TBS. Referring to FIG. 6, the apparatus, such as UE or eNB, may receive and decode TB and a feedback size indicator, and check (block 601) whether there are any erroneous code blocks in the transport block. If not, the apparatus determines (block 602) based on a predetermined table, e.g. Table 6, that a specific feedback type, e.g. feedback type 7 (the index of Table 6), is to be used, generates complementary information, and transmits the feedback message of the selected type 7. If there are erroneous code blocks in the transport block, the apparatus checks (block 603) if the number of CBs is more than 16. If not, the apparatus generates (block 605) and transmits a 16 bit feedback for 16 CBs. If the number of CBs is more than 16, the apparatus performs (block 604) grouping of the code blocks into 16 subsets, and generates (block 605) a 16 bit feedback for the 16 groups of CBs.

Figure 7:
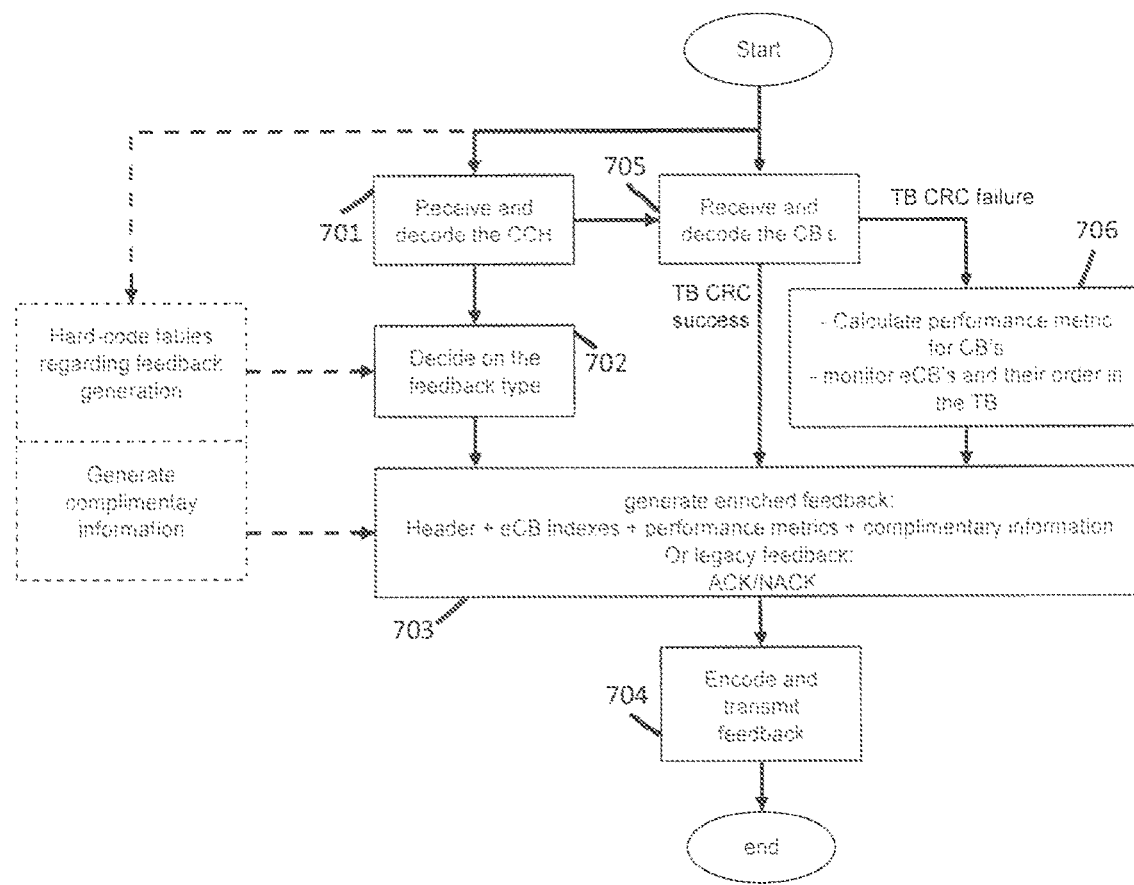
FIG. 7 is a flowchart illustrating overall feedback generation.

FIG. 7 is a flowchart illustrating overall feedback generation, wherein FIG. 7 illustrates the creating of the feedback message for the pool of CBs in an apparatus. Referring to FIG. 7, the apparatus, such as UE or eNB, receives (block 701) a feedback size indicator via control channel signalling. The apparatus also receives (block 705) a transport block. The apparatus selects (block 702) the format of a HARQ feedback message to be generated based on the corresponding feedback size indicator received in the apparatus. The apparatus detects (block 706) the number of failed code blocks (in case of a TB CRC failure) in the transport block, and the order of the failed code blocks in the transport block, and based on that calculates the performance metric. The apparatus generates (block 703) a HARQ feedback message, wherein the generated HARQ feedback message is of the selected format, e.g. indicates the index of each failed code block in the received transport block and includes a header and possibly complementary information/MI information. The apparatus may then encode and cause (block 704) transmission of the generated HARQ feedback message. In case of a TB CRC success, the apparatus may generate (block 703) a legacy HARQ feedback message, and encodes and causes (block 704) transmission of the generated legacy HARQ feedback message. If fixed-size feedback is applied (instead of dynamic size), steps in blocks 701 and 702 may be skipped, as the apparatus receives the feedback size indicator in the transport block, and based on that selects and generates the required feedback.

Figure 8:
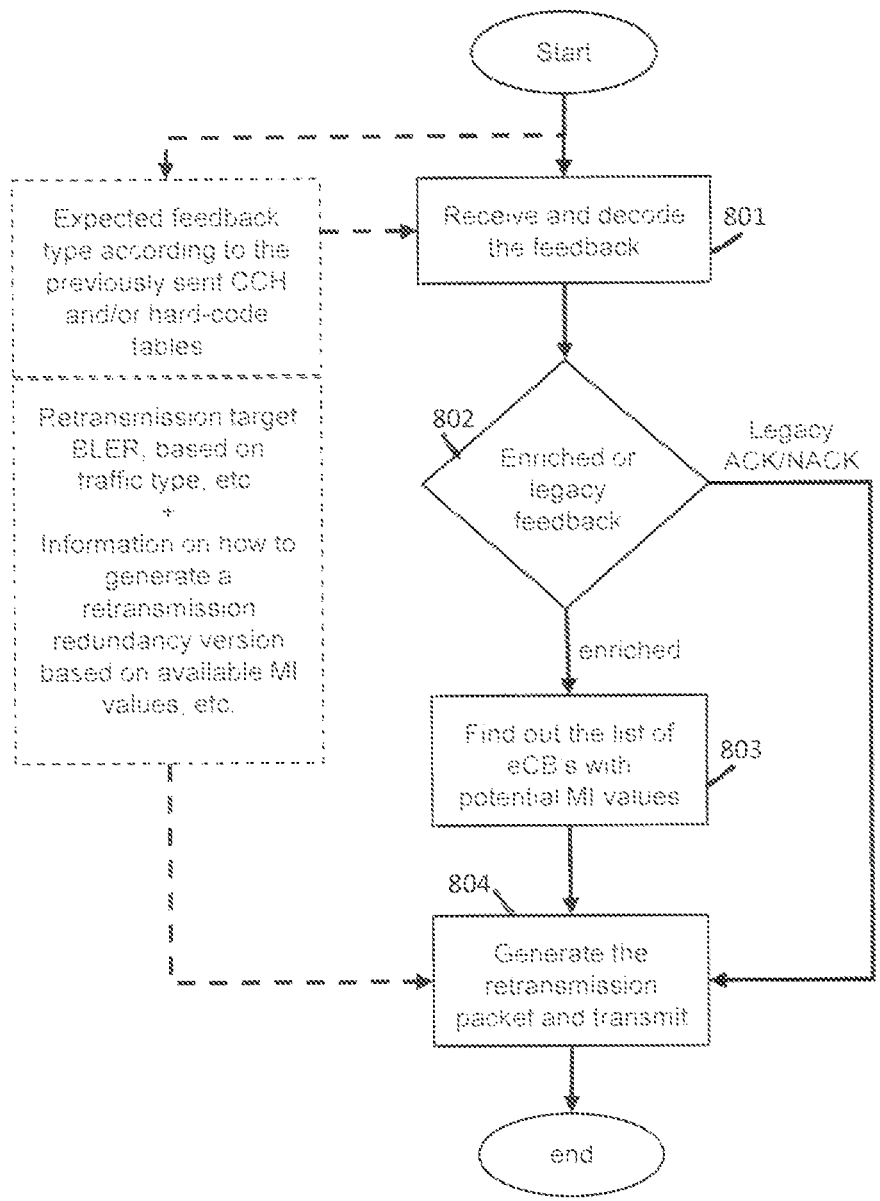
FIG. 8 is a flowchart illustrating retransmission packet generation.

FIG. 8 is a flowchart illustrating steps to be performed in an apparatus after receiving the feedback message, wherein FIG. 8 illustrates retransmission packet generation in the apparatus. Referring to FIG. 8, the apparatus, such as eNB or UE, may receive (block 801) and decode a HARQ feedback message. The apparatus checks (block 802) the format of the received HARQ feedback message. If the received feedback message is a legacy feedback message, the apparatus generates and transmits (block 804) a legacy retransmission packet (i.e. retransmits the whole TB). If the received feedback message is an enriched feedback message, the apparatus checks (803) the indexes of the failed code blocks (if any) and possible MI information/complementary information received in the feedback message, and, based on that, generates (block 804) a retransmission for the transport block such that the retransmission contains each or some of the original code blocks of the transport block, and causes transmission of the generated retransmission.

In 5G (especially in case of cmW), a few extra bits of extended HARQ feedback channel for multi-bit feedback is insignificant for overall control overhead. However, in LTE, the physical channel relies on HARQ feedback bit repetition. In LTE, very high reliability needs to be ensured even for cell edge users, thus requiring repetition coding for the feedback message. Cell-center users may experience extremely good channel conditions, implying that the feedback generation is over-dimensioned. In that case, link adaptation may be applied over the HARQ feedback channel, such that the feedback message carries more feedback bits than specified in the legacy systems.

The multi-bit feedback channel resources allocated to UE in UL need to be efficiently used in each case, including the case of successful decoding. In case of TB ACK which is typically expected in over 80% of the initial transmissions, the extra bits may be used to signal complementary information such as high resolution CQI reporting. This may be performed, for example, if UE realises a sudden change in the channel quality compared to the latest reported CQI.

Assuming equation (2) for the block error rate of individual CBs, if N (the number of CBs in TB) increases, then $BLER_{CBi}$ exponentially decreases. For example, for a 10% BLER target for TB with 4, 10 and 32 code blocks, a CB BLER target of ~2%, ~1% and ~0.3% is required respectively. For a given MCS, the difference between 10% and 1% BLER may typically be in the order of 1-2 dB. However, if the feedback reporting is capable of capturing the failure of TB in the resolution of CBs, then it is safe to impose the target BLER over the CBs and save energy for the initial transmission, as well as save energy by only performing the retransmissions on the CB level for eCBs. In that case, for the message of Table 1, the probability of having k failed CBs in TB with 10 CBs, when the CB target BLER (and the translatable TB target BLER) is increased, is illustrated in Table 7 by means of a few examples.

TABLE 7

Probability of k failed CBs out of 10 CBs

| Probability of having k failed CBs out of 10 CBs | BLER target of TB - BLER target of each CB | | | |
|---|---|---|---|---|
| | 10%-1% | 18%-2% | 40%-5% | 65%-10% |
| k = 1 | 0.104807418 | 0.200087328 | 0.501328785 | ~1 |
| k = 2 | 0.004943068 | 0.018015723 | 0.113098748 | 0.453916067 |
| k = 3 | 0.000138152 | 0.000961258 | 0.015119909 | 0.12156983 |
| k = 4 | 2.53389E−06 | 3.36587E−05 | 0.001326508 | 0.02136709 |
| k = 5 | 3.18684E−08 | 8.08162E−07 | 7.9802E−05 | 0.002575183 |

In Table 7, in case of TB target BLER of 40% (i.e. saving energy by setting a 5% CB target BLER), it is very unlikely to have 5 or more CBs fail in the decoding. Then by deploying CB resolution feedback, the transmitter is able to focus on retransmitting the failed CBs only (i.e. save energy). In terms of resources utilized for the retransmission, a 16% BLER target over TB with TB resolution feedback uses the same resources as a 40% BLER target over TB with CB resolution feedback does (assuming approximately ~3 CBs being retransmitted on average for the failed TBs). This is because the in former is to utilize a higher SINR to achieve the 10% target BLER.

Assuming a large TBS of 64 CBs, the hard-decision feedback per CB (ACK/NACK per CB) consumes at most 64 bits of the feedback message. Further, assuming a compression over the vector of 64 feedback bits, with a 2% probability for a failure of each CB (assuming independency of decoding for each CB), the Shannon limits of source coding indicate that a feedback message of at least ~10 bits is needed. For a 10% probability for a failure of CB, this number is increased to ~31 bits. However, this lower bound is too idealistic, since the vector of bits to be source encoded is finite. The lower bound, however, indicates how small the feedback message may be.

Therefore, CBs may be divided into groups and feedback bits may be allocated to soft decision and/or hard decision for the decoding of each group. Having each CB in one group results in a feedback per TB scenario. However, based on the availa-bility of the feedback bits in UL and the power limits of UE (it is not expected that mMTC UE sends more than 1 bit of feedback, but for eMBB UE the energy efficiency of UE is not as critical), an efficient multi-bit feedback message may be generated.

Assuming 64 CBs and only 8 bits of feedback (and not 64 bits, for example), an efficient approach is somewhere between the two extremes of 1) the overall performance metric extracted from the whole TB, and 2) the single-bit ACK/NACK per group of CBs (e.g. 8 groups of 8 CBs). The selection of the feedback message may be case-dependent as described above. Therefore, it is desirable to have a few bits of message header for defining the type of the feedback message and the number of bits to compli-ment the type of the feedback message with information on the status of the decoders.

Instead of 5G transport blocks, an embodiment may also be applicable to other type of transport blocks or transport items utilized by 5G or other communication technologies.

Figure 9:
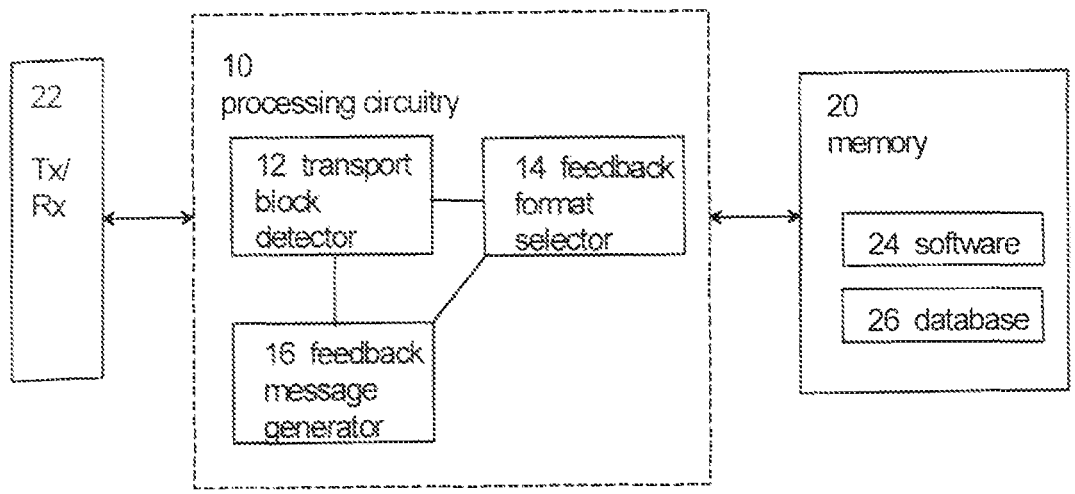
FIGS. 9 and 10 illustrate blocks diagrams of apparatuses according to an embodiment of the invention.

An embodiment provides an apparatus (first apparatus) comprising at least one processor and at least one memory including a computer program code, wherein the at least one memory and the computer program code are configured, with the at least one processor, to cause the apparatus to carry out the procedures of the above-described network element, network node or terminal device (first apparatus). The at least one processor, the at least one memory, and the computer program code may thus be considered as an embodiment of means for executing the above-described procedures of the network element or the terminal device. FIG. 9 illustrates a block dia-gram of a structure of such an apparatus. The apparatus may be comprised in the network element or in the terminal device, e.g. the apparatus may form a chipset or a circuitry in the network element or in the terminal device. In some embodiments, the apparatus is the network element or the terminal device. The apparatus comprises a processing circuitry 10 comprising the at least one processor. The processing circuitry 10 may comprise a transport block detector 12 configured to detect the number of failed code blocks in a transport block transmitted from a second apparatus and a corresponding feedback size indicator, wherein the feedback size indicator is received via control channel signalling, and/or the feedback size indicator is received as the number of code blocks in the transport block, as a transport block size, or as other information indicated in the transport block. The processing circuitry 10 may comprise a feedback format selector 14 configured to select the format of a HARQ feedback message to be generated based on the corresponding feedback size indicator. The processing circuitry 10 may further comprise a feedback message generator configured to generate and transmit a HARQ feedback message based on the number of failed code blocks in the transport block, wherein the HARQ feedback message is of the selected format and indicates each failed code block in the transport block if any.

The processing circuitry 10 may comprise the circuitries 12, 14 and 16 as sub-circuitries, or they may be considered as computer program modules executed by the same physical processing circuitry. The memory 20 may store one or more computer program products 24 comprising program instructions that specify the operation of the circuitries 12 to 16. The memory 20 may further store a database 26 comprising definitions for HARQ feedback formats, for example. The apparatus may further comprise a radio interface 22 providing the apparatus with radio communication capability with the network nodes or terminal devices. The radio interface may comprise a radio communication circuitry enabling wireless communications and comprise a radio frequency signal processing circuitry and a baseband signal processing circuitry. The baseband signal processing circuitry may be configured to carry out the functions of a transmitter and/or a receiver. In some embodiments, the radio interface may be connected to a remote radio head comprising at least an antenna and, in some embodiments, radio frequency signal processing in a remote location with respect to a base station. In such embodiments, the radio interface may carry out only some of radio frequency signal processing or no radio frequency signal processing at all. The connection between the radio interface and the remote radio head may be an analogue connection or a digital connection. In some embodiments, the radio interface may comprise a fixed communication circuitry enabling wired communications.

Figure 10:
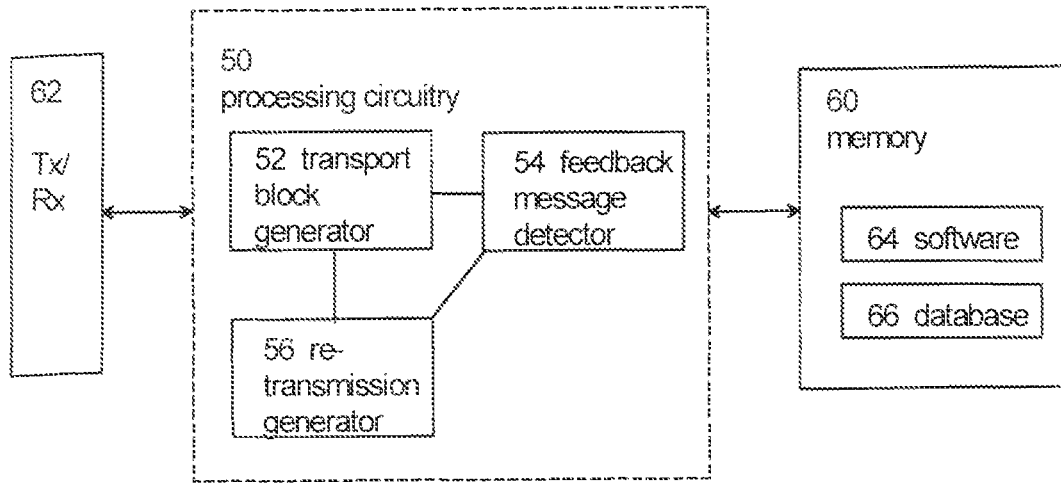

An embodiment provides an apparatus (second apparatus) comprising at least one processor and at least one memory including a computer program code, wherein the at least one memory and the computer program code are configured, with the at least one processor, to cause the apparatus to carry out the procedures of the above-described network element or the terminal device. The at least one processor, the at least one memory, and the computer program code may thus be considered as an embodiment of means for executing the above-described procedures of the network element or the terminal device (second apparatus). FIG. 10 illustrates a block dia-gram of a structure of such an apparatus. The apparatus may be comprised in the network element or the terminal device, e.g. the apparatus may form a chipset or a circuitry in network element or the terminal device. In some embodiments, the apparatus is the network element or the terminal device. The apparatus comprises a processing circuitry 50 comprising the at least one processor. The processing circuitry 50 may comprise a transport block generator 52 configured to generate and transmit a transport block and a corresponding feedback size indicator to a first apparatus, wherein the feedback size indicator is transmitted to the first apparatus via control channel signalling, and/or of the feedback size indicator is transmitted to the first apparatus as the number of code blocks in the transport block, as a transport block size, or as other information indicated in the transport block. The processing circuitry 50 may comprise a feedback message detector 54 configured to receive a HARQ feedback message generated in the first apparatus based on the number of failed code blocks in the transport block, wherein the HARQ feedback message indicates each failed code block in the transport block, if any. The processing circuitry 50 may further comprise a retransmission generator configured to generate and transmit a retransmission for the transport block based on the format of the received HARQ feedback message, wherein the retransmission includes each or some of the original code blocks in the transport block.

The processing circuitry 50 may comprise the circuitries 52, 54 and 56 as sub-circuitries, or they may be considered as computer program modules executed by the same physical processing circuitry. The memory 60 may store one or more computer program products 64 comprising program instructions that specify the operation of the circuitries 52 to 56. The memory 60 may further store a database 66 comprising definitions for HARQ feedback formats, for example. The apparatus may further comprise a radio interface 62 providing the apparatus with radio communication capability with the terminal devices. The radio interface may comprise a radio communication circuitry enabling wireless communications and comprise a radio frequency signal processing circuitry and a baseband signal processing circuitry. The baseband signal processing circuitry may be configured to carry out the functions of a transmitter and/or a receiver. In some embodiments, the radio interface may be connected to a remote radio head comprising at least an antenna and, in some embodiments, radio frequency signal processing in a remote location with respect to a base station. In such embodiments, the radio interface may carry out only some of radio frequency signal processing or no radio frequency signal processing at all. The connection between the radio interface and the remote radio head may be an analogue connection or a digital connection. In some embodiments, the radio interface may comprise a fixed communication circuitry enabling wired communications.

As used in this application, the term 'circuitry' refers to all of the following: (a) hardware-only circuit implementations such as implementations in only analog and/or digital circuitry; (b) combinations of circuits and software and/or firmware, such as (as applicable): (i) a combination of processor(s) or processor cores; or (ii) portions of processor(s)/software including digital signal processor(s), software, and at least one memory that work together to cause an apparatus to perform specific functions; and (c) circuits, such as a microprocessor(s) or a portion of a microprocessor(s), that require software or firmware for operation, even if the software or firmware is not physically present.

This definition of 'circuitry' applies to all uses of this term in this application. As a further example, as used in this application, the term "circuitry" would also cover an implementation of merely a processor (or multiple processors) or portion of a processor, e.g. one core of a multi-core processor, and its (or their) accompanying software and/or firmware. The term "circuitry" would also cover, for example and if applicable to the particular element, a baseband integrated circuit, an application-specific integrated circuit (ASIC), and/or a field-programmable grid array (FPGA) circuit for the apparatus according to an embodiment of the invention.

The processes or methods described above in connection with FIGS. 1 to 10 may also be carried out in the form of one or more computer process defined by one or more computer programs. The computer program shall be considered to encompass also a module of a computer programs, e.g. the above-described processes may be carried out as a program module of a larger algorithm or a computer process. The computer program(s) may be in source code form, object code form, or in some intermediate form, and it may be stored in a carrier, which may be any entity or device capable of carrying the program. Such carriers include transitory and/or non-transitory computer media, e.g. a record medium, computer memory, read-only memory, electrical carrier signal, telecommunications signal, and software distribution package. Depending on the processing power needed, the computer program may be executed in a single electronic digital processing unit or it may be distributed amongst a number of processing units.

The present invention is applicable to cellular or mobile communication systems defined above but also to other suitable communication systems. The proto-cols used, the specifications of cellular communication systems, their network elements, and terminal devices develop rapidly. Such development may require extra changes to the described embodiments. Therefore, all words and expressions should be interpreted broadly and they are intended to illustrate, not to restrict, the embodiment.

It will be obvious to a person skilled in the art that, as the technology ad-vances, the inventive concept can be implemented in various ways. The invention and its embodiments are not limited to the examples described above but may vary within the scope of the claims.

LIST OF ABBREVIATIONS

DL downlink
UL uplink
HARQ hybrid automatic repeat request
BLER block error rate
LTE long term evolution
5G 5th generation
RTT round trip time
NDI new data indicator
RV redundancy version
CCH control channel
RIV resource indication value
RB resource block
MBB mobile broadband
MCC mission critical communication
HSPA high speed packet access
HICH HARQ indicator channel
MI mutual information
CB code block
CBS code block size
eCB erroneous code block
TB transport block
CRC cyclic redundancy check
SINR signal-to-interference-plus-noise ratio

The invention claimed is:

1. An apparatus comprising
at least one processor; and
at least one non-transitory memory including a computer program code, wherein the at least one memory and the computer program code are configured, with the at least one processor, to cause the apparatus to at least to:
detect a number of failed code blocks in a transport block received from a second apparatus and a corresponding feedback size indicator;
select a format of a hybrid automatic repeat request feedback message to be generated based on the corresponding feedback size indicator;
generate the hybrid automatic repeat request feedback message based on the number of failed code blocks in the transport block, wherein the generated hybrid automatic repeat request feedback message is of the selected format and indicates each failed code block in the transport block if any, and comprises a performance metric relating to information on a decoder performance regarding the failed code blocks;
transmit the generated hybrid automatic repeat request feedback message to the second apparatus; and
at least one of:
receive the feedback size indicator from the second apparatus via control channel signalling, or
receive the feedback size indicator from the second apparatus as the number of code blocks in the transport block, as a transport block size, or as other information indicated in the transport block.

2. The apparatus of claim 1, wherein the at least one memory and the computer program code are further configured, with the at least one processor, to cause the apparatus to at least to:
generate the hybrid automatic repeat request feedback message based on a decoder output for each individual code block in case of an overall transport block CRC failure.

3. The apparatus of claim 1, wherein
the generated hybrid automatic repeat request feedback message comprises a header indicating the type of information signalled in the hybrid automatic repeat request feedback message.

4. The apparatus of claim 1, wherein the hybrid automatic repeat request feedback message comprises complementary information in case of an overall transport block CRC success.

5. The apparatus of claim 1, wherein the at least one memory and the computer program code are further configured, with the at least one processor, to cause the apparatus to at least one of:
receive a format of complementary information from the second apparatus via the control channel signalling;
maintain or retrieve information on a format of complementary information;
select a format of complementary information; or
indicate the format of complementary information in a header of a message signalled to the second apparatus.

6. The apparatus of claim 1, wherein the at least one memory and the computer program code are further configured, with the at least one processor, to cause the apparatus to:
apply link adaptation over a hybrid automatic repeat request feedback channel to modify a repetition order of the hybrid automatic repeat request feedback message according to hybrid automatic repeat request feedback channel conditions.

7. The apparatus of claim 1, wherein the at least one memory and the computer program code are further configured, with the at least one processor, to further cause the apparatus to at least:
maintain or retrieve an indexed table indicating the format of the hybrid automatic repeat request feedback message for a specific number of failed code blocks in the transport block based on the feedback size indicator.

8. The apparatus of claim 1, wherein the at least one memory and the computer program code are further configured, with the at least one processor, to further cause the apparatus to at least:
change a hybrid automatic repeat request feedback mode for an active hybrid automatic repeat request stop-and-wait channel, wherein the hybrid automatic repeat request feedback mode is changed from a single-bit feedback mode to a multi-bit feedback mode, or vice versa.

9. The apparatus of claim 1, wherein the at least one memory and the computer program code are further configured, with the at least one processor, to further cause the apparatus to at least:
pool code blocks corresponding to a specific hybrid automatic repeat request feedback process and being received via different layers, antennas and/or multi-connectivity techniques together to generate an overall hybrid automatic repeat request process-specific multi-bit hybrid automatic repeat request feedback message.

10. The apparatus of claim 1, wherein the hybrid automatic repeat request feedback message indicates each failed code block in the transport block by indicating an index of the failed code block in the transport block.

11. The apparatus of claim 1, wherein
the hybrid automatic repeat request feedback message is transmitted on an uplink channel, wherein the apparatus comprises a terminal device and the second apparatus comprises a network node, or
the hybrid automatic repeat request feedback message is transmitted on a downlink channel, wherein the apparatus comprises a network node and the second apparatus comprises a terminal device.

12. An apparatus comprising
at least one processor; and
at least one non-transitory memory including a computer program code, wherein the at least one memory and the computer program code are configured, with the at least one processor, to cause the apparatus to:
transmit a feedback size indicator to another apparatus via control channel signalling, and/or
transmit the feedback size indicator to the other apparatus as a number of code blocks in a transport block, as a transport block size, or as other information indicated in the transport block;
receive a hybrid automatic repeat request feedback message from the other apparatus based on a number of failed code blocks in the transport block, wherein the hybrid automatic repeat request feedback message indicates each failed code block in the transport block if any and comprises a performance metric relating to information on a decoder performance regarding the failed code blocks;
generate a retransmission for the transport block based on a format of the received hybrid automatic repeat request feedback message, wherein the retransmission includes each or some of the code blocks in the transport block; and
transmit the generated retransmission to the other apparatus.

13. The apparatus of claim 12, wherein the at least one memory and the computer program code are further configured, with the at least one processor, to further cause the apparatus to at least:
interpret the received hybrid automatic repeat request feedback message based on a hybrid automatic repeat request feedback message header.

14. The apparatus of claim 12, wherein the at least one memory and the computer program code are further configured, with the at least one processor, to further cause the apparatus to at least:
generate the retransmission based on the performance metric included in the received hybrid automatic repeat request feedback message, the performance metric including channel information, such as a received SINR, accumulated mutual information MI, bit-wise mutual information BMI, and/or normalized accumulated mutual information NACMI, regarding the failed code blocks.

15. The apparatus of claim 12, wherein the at least one memory and the computer program code are further configured, with the at least one processor, to further cause the apparatus to at least:
set a target BLER for the retransmission, wherein the target BLER depends on at least one of
the feedback size indicator,
the format of the hybrid automatic repeat request feedback message,
a performance metric included in the received hybrid automatic repeat request feedback message,
the code blocks or the transport block to be retransmitted, and
a traffic type of the retransmission and/or the initial transmission.

16. The apparatus of claim 12, wherein the at least one memory and the computer program code are further configured, with the at least one processor, to further cause the apparatus to at least:
maintain or retrieve an indexed table indicating the format of the hybrid automatic repeat request feedback message for a specific number of failed code blocks in the transport block based on the feedback size indicator.

17. The apparatus of claim 12, wherein the at least one memory and the computer program code are further configured, with the at least one processor, to further cause the apparatus to at least:
change a hybrid automatic repeat request feedback mode for an active hybrid automatic repeat request stop-and-wait channel, wherein the hybrid automatic repeat request feedback mode is changed from a single-bit feedback mode to a multi-bit feedback mode, or vice versa.

18. The apparatus of claim 12, wherein
the hybrid automatic repeat request feedback message is received on a downlink channel, wherein the apparatus comprises a terminal device and the other apparatus comprises a network node, or
the hybrid automatic repeat request feedback message is received on an uplink channel, wherein the apparatus comprises a network node and the other apparatus comprises a terminal device.

19. A method comprising
causing transmission of a transport block and a corresponding feedback size indicator to a first apparatus from a second apparatus of a communications system, and at least one of:
causing, in the second apparatus, the transmission of the feedback size indicator to the first apparatus via control channel signalling, or
causing, in the second apparatus, the transmission of the feedback size indicator to the first apparatus as the number of code blocks in the transport block, as a transport block size, or as other information indicated in the transport block;
and wherein the method further comprises:
receiving, in the second apparatus, a hybrid automatic repeat request feedback message generated in the first apparatus based on the number of failed code blocks in the transport block, wherein the hybrid automatic repeat request feedback message indicates each failed code block in the transport block if any and comprises a performance metric relating to information on a decoder performance regarding the failed code blocks;

generating, in the second apparatus, a retransmission for the transport block based on the format of the received hybrid automatic repeat request feedback message, wherein the retransmission includes each or some of the original code blocks in the transport block; and causing, in the second apparatus, transmission of the generated re-transmission to the first apparatus.

20. The method of claim 19, further comprising interpreting, in the second apparatus, the received hybrid automatic repeat request feedback message based on a hybrid automatic repeat request feedback message header.

21. The method of claim 19, further comprising generating, in the second apparatus, the retransmission based on the performance metric included in the received hybrid automatic repeat request feedback message, the performance metric including channel information, such as a received SINR, accumulated mutual information MI, bit-wise mutual information BMI, and/or normalized accumulated mutual information NACMI, regarding the failed code blocks.

* * * * *